United States Patent
Nada (10) Patent No.: US 11,325,454 B2
(45) Date of Patent: May 10, 2022

(54) METHOD OF DESIGNING MACHINE

(71) Applicant: TOYOTA JIDOSHA KABUSHIKI KAISHA, Toyota (JP)

(72) Inventor: Mitsuhiro Nada, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 933 days.

(21) Appl. No.: 16/017,214

(22) Filed: Jun. 25, 2018

(65) Prior Publication Data

US 2019/0005183 A1 Jan. 3, 2019

(30) Foreign Application Priority Data

Jun. 28, 2017 (JP) .............................. JP2017-125996

(51) Int. Cl.
*B60K 6/32* (2007.10)
*H01M 8/24* (2016.01)
*B60L 50/90* (2019.01)
*B60L 50/64* (2019.01)
*B60L 50/72* (2019.01)
(Continued)

(52) U.S. Cl.
CPC ............... *B60K 6/32* (2013.01); *B60L 50/64* (2019.02); *B60L 50/72* (2019.02); *B60L 50/75* (2019.02); *B60L 50/90* (2019.02); *B62D 65/00* (2013.01); *G06F 30/15* (2020.01); *H01M 8/249* (2013.01); *H01M 16/006* (2013.01); *B60L 2200/36* (2013.01); *B60L 2240/42* (2013.01); *H01M 2220/20* (2013.01); *H01M 2250/20* (2013.01)

(58) Field of Classification Search
CPC .. B60K 6/32; B60K 6/28; B60L 50/72; B60L 50/64; B60L 50/75; B60L 50/90; B60L 2200/36; B60L 2240/42; B62D 65/00; H01M 8/249; H01M 16/006; H01M 2220/20; H01M 2250/20
See application file for complete search history.

(56) References Cited

U.S. PATENT DOCUMENTS 4,409,784 A 10/1983 VanGinhoven et al.
5,409,784 A 4/1995 Bromberg et al.
(Continued)

FOREIGN PATENT DOCUMENTS

CN 101821891 B 11/2014
DE 102008022226 A1 4/2009
(Continued)

*Primary Examiner* — John D Walters
(74) *Attorney, Agent, or Firm* — Finnegan, Henderson, Farabow, Garrett & Dunner, LLP (57) ABSTRACT

A method of designing a machine on which a drive motor, a fuel cell stack, and a secondary battery are mounted includes: determining a maximum output of the drive motor to be a first output value and an output of the drive motor when a vehicle travels under a cruise condition to be a second output value; determining the number of fuel cell stacks to be mounted to be n; and determining a maximum output of the secondary battery to be a value obtained by subtracting a value obtained by multiplying a maximum output of the fuel cell stack by the n, from the first output value. A value obtained by multiplying the third output value by the n is equal to or larger than the second output value, and a value obtained by multiplying the third output value by (n−1) is less than the second output value.

7 Claims, 10 Drawing Sheets

(51) Int. Cl.
*G06F 30/15* (2020.01)
*B60L 50/75* (2019.01)
*B62D 65/00* (2006.01)
*H01M 8/249* (2016.01)
*H01M 16/00* (2006.01)

(56) References Cited

U.S. PATENT DOCUMENTS

| | | | |
|---|---|---|---|
| 6,555,928 B1 | 4/2003 | Mizuno et al. | |
| 7,338,335 B1 | 3/2008 | Messano | |
| 9,802,505 B2 * | 10/2017 | Oda | B60L 58/13 |
| 2004/0056633 A1 * | 3/2004 | Sugiura | H01M 16/003 |
| | | | 320/101 |
| 2010/0221633 A1 | 9/2010 | Fujita et al. | |

FOREIGN PATENT DOCUMENTS

| | | |
|---|---|---|
| JP | 2000-073779 A | 3/2000 |
| JP | 2001-95107 | 4/2001 |
| JP | 2002-063923 A | 2/2002 |
| JP | 2002-118979 | 4/2002 |
| JP | 2016-147519 A | 8/2016 |
| JP | 2017-81319 | 5/2017 |
| WO | WO 2004/024845 A2 | 3/2004 |

* cited by examiner

METHOD OF DESIGNING MACHINE

INCORPORATION BY REFERENCE

The disclosure of Japanese Patent Application No. 2017-125996 filed on Jun. 28, 2017 including the specification, drawings and abstract is incorporated herein by reference in its entirety.

BACKGROUND

1. Technical Field

This disclosure relates to a method of designing a machine on which a fuel cell stack and a motor are mounted.

2. Description of Related Art

Japanese Unexamined Patent Application Publication No. 2017-081319 (JP 2017-081319 A) discloses a hybrid vehicle that is provided with an internal combustion engine and a motor that is driven by power supply from a secondary battery.

SUMMARY

As a condition that has to be satisfied in a design of an automobile, a condition that a vehicle can travels under a cruise condition (hereinafter referred to as cruise traveling) can be mentioned. The cruise condition is a condition that the vehicle can continue to travel under a predetermined traveling condition for a predetermined time. The predetermined traveling condition is determined as a vehicle speed determined in a design, an uphill grade, or the like.

Further, as a condition that has to be satisfied in a design of an automobile, a condition that the maximum output as a design value can be exerted can be mentioned. In the case of a hybrid vehicle, the maximum output is exerted by simultaneously driving an internal combustion engine and a motor. In terms of satisfying the maximum output, a breakdown of output is optional. That is, as long as the sum of the output from the internal combustion engine and the output from the motor satisfies the maximum output, each maximum output may be any value.

The internal combustion engine that is mounted on an automobile has a history that development has been continued for a long period of time, and therefore, a design of an automobile to change a size or output in accordance with the automobile that is newly designed can be performed relatively easily. With respect to a secondary battery that is mounted on a hybrid vehicle, a design concept that it is merely needed to be able to exert output capable of supporting the output of the internal combustion engine was a mainstream. For this reason, with respect to the secondary battery, downsizing has been emphasized.

As described above, with respect to a design in which an internal combustion engine is set as a main drive source, a technique is mature, and with respect to a development cost and a development period, a big problem hardly occurs.

In contrast to the above, circumstances for designing a fuel cell vehicle differ from those of the hybrid vehicle as described above. In a design of a fuel cell, similar to the design of the internal combustion engine, adjusting of various parts or modules is needed. However, the development history of the fuel cell is shallow compared to that of the internal combustion engine. For this reason, when the size or output of a fuel cell stack is optionally designed, the number of processes or a cost needed for the design become enormous. For this reason, when a fuel cell vehicle is newly designed by referring the design concept of the hybrid vehicle, a possibility that a development cost may increase and a development period may lengthen occurs.

The circumstances described above are not limited to the automobile and are common to a machine on which a fuel cell stack is mounted. The machine as referred to herein means the overall machine on which a drive motor is mounted. The disclosure provides a method of designing a machine in which a development cost and a development period for newly designing a machine on which a fuel cell stack and a drive motor are mounted are reduced.

An aspect of this disclosure relates to a method of designing a machine on which a drive motor, a fuel cell stack configured to generate an electric current for driving the drive motor, and a secondary battery configured to discharge an electric current for driving the drive motor are mounted. The method includes determining the maximum output of the drive motor to be a first output value and an output of the drive motor in a cruise condition to be a second output value, determining the number of fuel cell stacks to be mounted to be n, n being a natural number, and an output value outputted by the fuel cell stacks when the vehicle travels under the cruise condition being a third output value, and determining a maximum output of the secondary battery to be a value obtained by subtracting a value obtained by multiplying a maximum output of the fuel cell stack by the n, from the first output value. A value obtained by multiplying the third output value by the n is equal to or larger than the second output value, and a value obtained by multiplying the third output value by (n−1) is less than the second output value.

In the method according to the aspect of the disclosure, the method of designating the fuel cell stack may be the same as a method of designing a fuel cell stack mounted on a machine designed separately from the machine. According to the aspect of the disclosure, since the method of designating the fuel cell stack for another machine can be used or referred, a development cost and a development period for newly designing a machine are reduced. Further, by designing the secondary battery as described above, it is possible to perform a design to satisfy the maximum output.

In the method according to the aspect of the disclosure, the machine may be designed such that, when the vehicle travels under the cruise condition, a state of charge (SOC) of the secondary battery is maintained. According to the aspect of the disclosure, in the cruise condition, the SOC of the secondary battery is maintained. Furthermore, when the maximum output has to be exerted, the situation that a time for which the maximum output can be exerted becomes slight due to the shortage of the SOC can be avoided.

The method according to the aspect of the disclosure may further include designing the machine so as to be installed with a fuel cell converter electrically connected to the fuel cell stack, the fuel cell converter being configured to control a power generation voltage of the fuel cell stack, a hydrogen tank configured to store hydrogen for being supplied to the fuel cell stack, and auxiliary machinery for power generation by the fuel cell stack, and designing the machine so as to be installed with at least one of the fuel cell converter, the hydrogen tank, and the auxiliary machinery by n sets when the n is 2 or more. According to the aspect of the disclosure, the design can also be used or referred to at least one of the fuel cell converter, the hydrogen tank, and the auxiliary machinery.

In the method according to the aspect of the disclosure, the machine may be an automobile. According to the aspect of the disclosure, the method according to the aspect of the disclosure can be applied to a design of the automobile.

In the method according to the aspect of the disclosure, in a case where the n is 2 or more, the automobile may be a motor truck. According to the aspect of the disclosure, it becomes easy to perform an appropriate design in terms of a mounting space and the relationship between the maximum output and the output in the cruise condition. The aspect of the disclosure does not preclude a case where n is 1 when the machine is a motor truck.

In the method according to the aspect of the disclosure, when the automobile is a motor truck, the n may be 2 or more. According to the aspect of the disclosure, it becomes easy to perform an appropriate design in terms of a mounting space and the relationship between the maximum output and the output when the vehicle travels under the cruise condition. The aspect of the disclosure does not preclude a case where the machine is an automobile other than a motor truck when n is 2 or more. For example, the machine may be a large-sized bus or the like.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
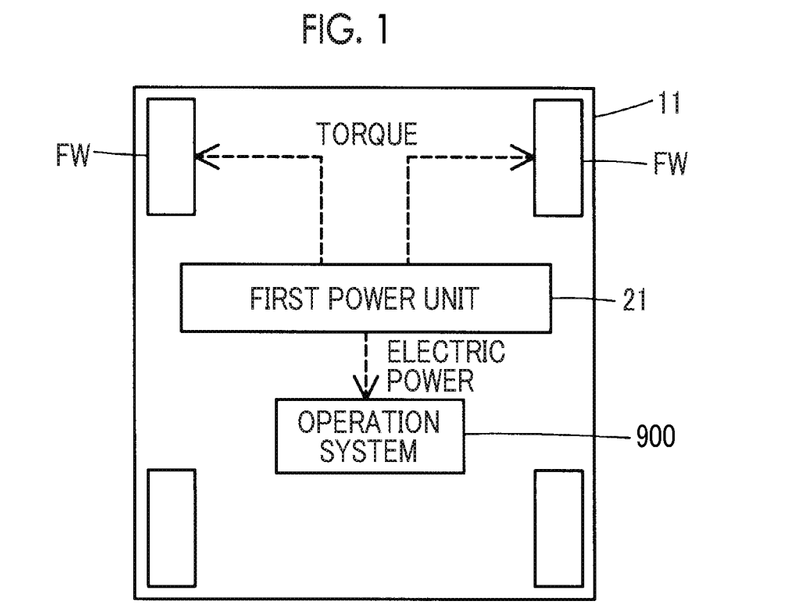
FIG. 1 is a diagram showing a fuel cell vehicle.
Figure 2:
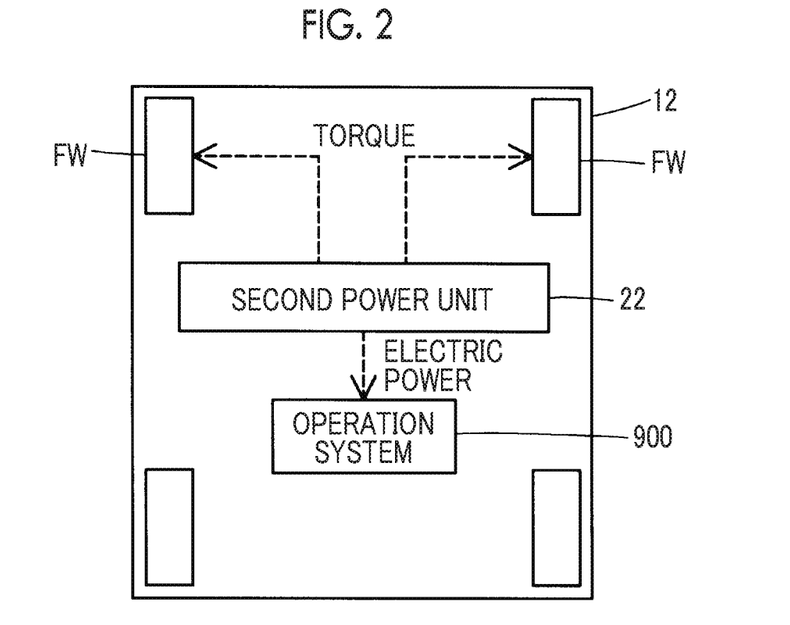
FIG. 2 is a diagram showing a fuel cell vehicle.
Figure 3:
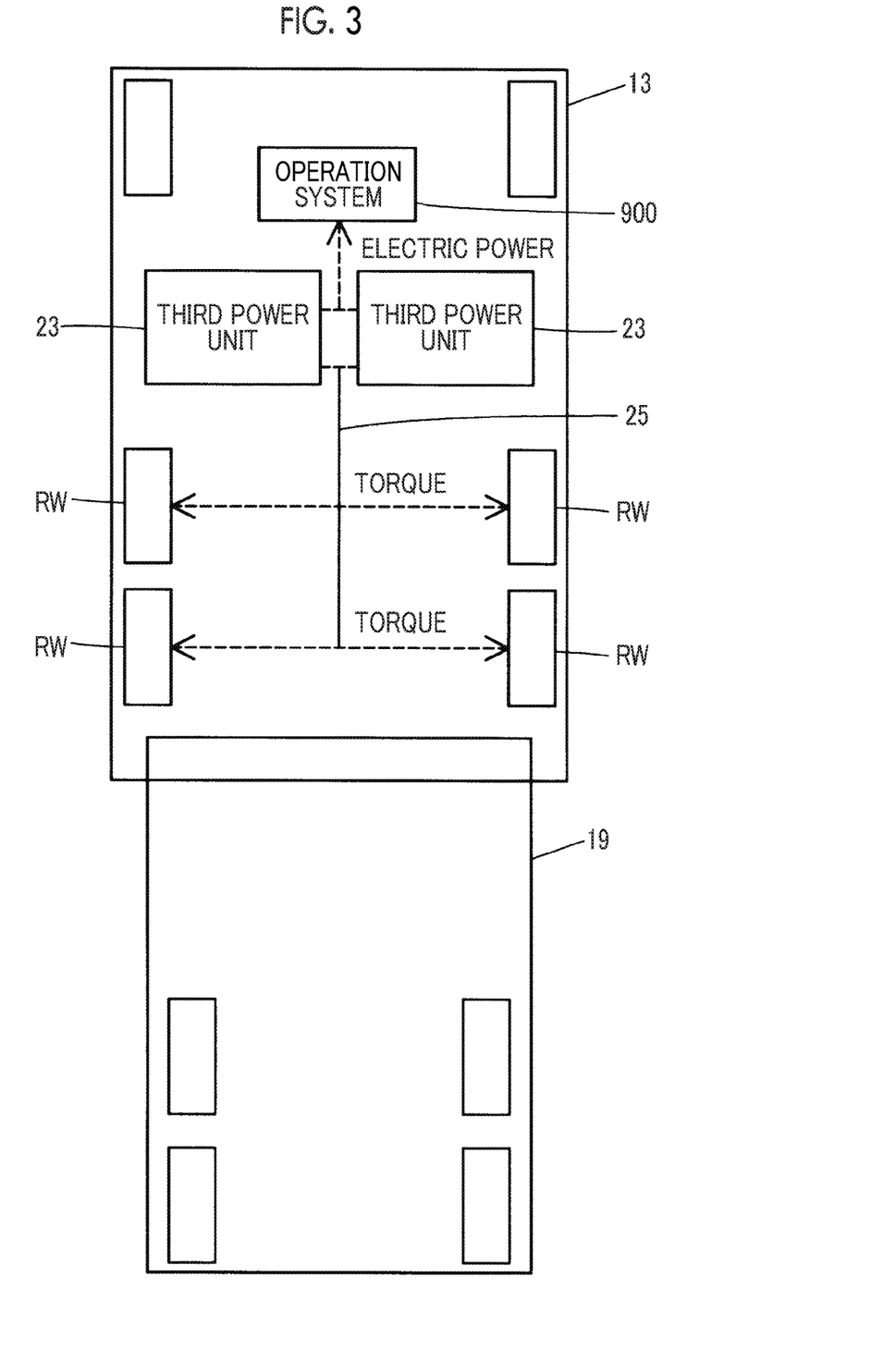
FIG. 3 is a diagram showing a fuel cell vehicle.

FIG. 1 shows a fuel cell vehicle 11. FIG. 2 shows a fuel cell vehicle 12. FIG. 3 shows a fuel cell vehicle 13. The fuel cell vehicles 11, 12 are passenger cars. The fuel cell vehicle 13 is a motor truck. The fuel cell vehicle 13 tows a trailer 19.

The fuel cell vehicle 11 is provided with a first power unit 21 and an operation system 900. The fuel cell vehicle 12 is provided with a second power unit 22 and the operation system 900. The fuel cell vehicle 13 is provided with two third power units 23, a propeller shaft 25, and the operation system 900. Each of the first power unit 21, the second power unit 22, and the two third power units 23 has a function of performing power generation by a fuel cell, as will be described later.

The operation system 900 is a generic term for devices that are operated by a driver for driving. The operation system 900 includes an accelerator pedal, a brake pedal, a steering wheel, and the like. The operation system 900 is not exactly the same in the fuel cell vehicles 11, 12, 13. However, in this embodiment, the devices are referred to as the operation system 900 in common in the fuel cell vehicles 11, 12, 13. A single operation system 900 is mounted on each of the fuel cell vehicles 11, 12, 13.

The first power unit 21 supplies electric power to the operation system 900. The second power unit 22 supplies electric power to the operation system 900. Each of the two third power units 23 supplies electric power to the operation system 900.

The first power unit 21 generates torque for driving two front wheels FW. The second power unit 22 generates torque for driving two front wheels FW. Each of the third power units 23 generates torque for driving four rear wheels RW. The torque generated by the two third power units 23 is transmitted to the four rear wheels RW through a single propeller shaft 25.

Figure 4:
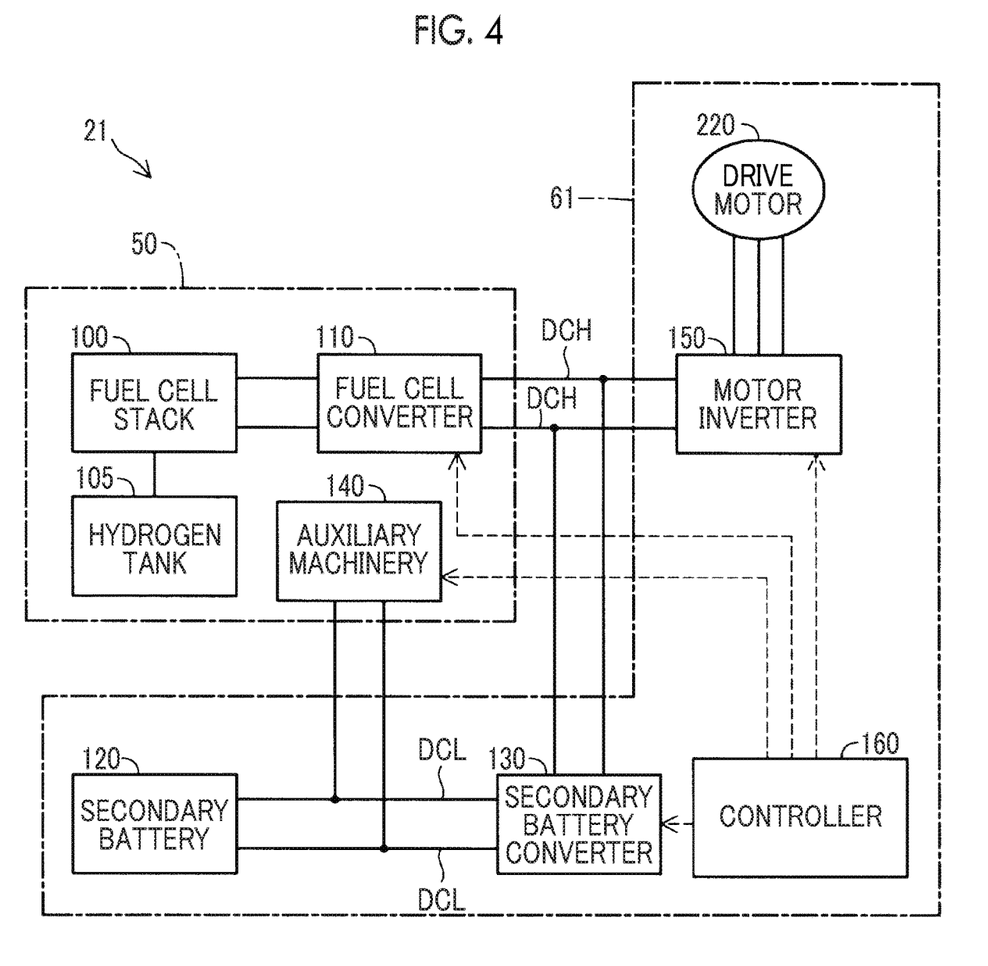
FIG. 4 is a block diagram showing a configuration of a first power unit.

FIG. 4 is a block diagram showing the configuration of the first power unit 21. The first power unit 21 is provided with a fuel cell module 50 and an electric system 61. The fuel cell module 50 is provided with a fuel cell stack 100, a hydrogen tank 105, a fuel cell converter 110, and auxiliary machinery 140. The electric system 61 is provided with a secondary battery 120, a secondary battery converter 130, a motor inverter 150, a controller 160, and a drive motor 220.

Figure 5:
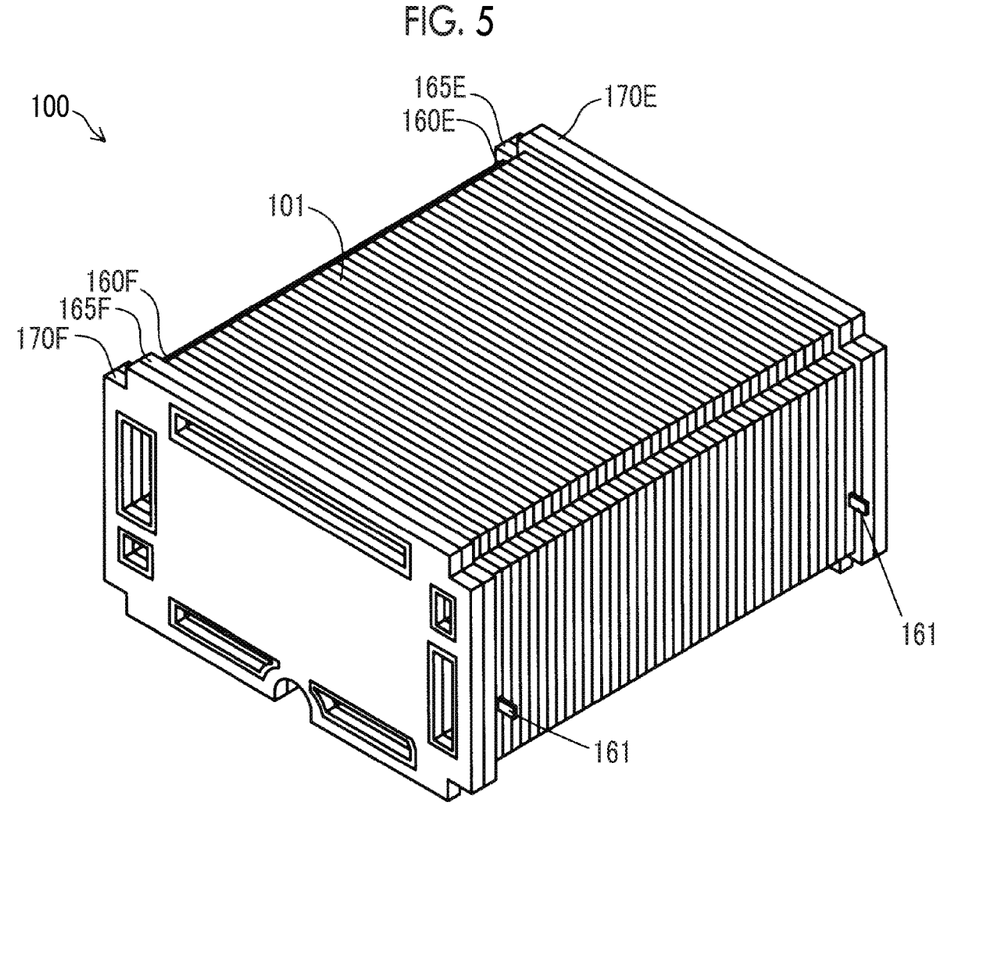
FIG. 5 is a perspective view showing a fuel cell stack.

FIG. 5 is a perspective view showing the fuel cell stack 100. In the fuel cell stack 100, a plurality of cells 101 stacked in a stacking direction is sandwiched between a pair of end plates 170F, 170E. The fuel cell stack 100 has a terminal plate 160F with an insulating plate 165F interposed between the end plate 170F on one end side and the cell 101.

The fuel cell stack 100 also has a terminal plate 160E on the rear end side with an insulating plate 165E on the rear end side likewise interposed between the end plate 170E and the cell 101. The outline of each of the cell 101, the terminal plates 160F, 160E, the insulating plates 165F, 165E, and the end plates 170F, 170E has a substantially rectangular shape.

The terminal plate 160F on the front end side and the terminal plate 160E on the rear end side are current collecting plates and output the collected electric power from current collecting terminals 161 to the outside.

The hydrogen tank 105 stores hydrogen for being supplied to the fuel cell stack 100. The fuel cell stack 100 is electrically connected to the fuel cell converter 110. The fuel cell converter 110 performs a boosting operation that boosts the output voltage of the fuel cell stack 100 to a target voltage. The fuel cell converter 110 is electrically connected to the motor inverter 150 through a high-voltage direct current wire DCH.

The secondary battery 120 is a lithium ion secondary battery. The secondary battery 120 in this embodiment is a lithium titanate secondary battery. The lithium titanate secondary battery is one type of lithium ion secondary battery. The secondary battery 120 in another embodiment may be a lithium ion secondary battery other than the lithium titanate secondary battery, or may be a secondary battery other than the lithium ion secondary battery. The secondary battery 120 is electrically connected to the secondary battery converter 130 through a low-voltage direct current wire DCL. The secondary battery 120 has a structure in which a plurality of cells is stacked in series. In another embodiment, the secondary battery 120 may be of a type in which voltage is maintained in series and energy is maintained by parallel connection.

The secondary battery converter 130 is electrically connected to the fuel cell converter 110 and the motor inverter 150 through the high-voltage direct current wire DCH. The secondary battery converter 130 controls the charging and discharging of the secondary battery 120 by adjusting the voltage in the high-voltage direct current wire DCH, which is an input voltage of the motor inverter 150.

The secondary battery converter 130 causes the secondary battery 120 to perform power supply, in a case where the output electric power from the fuel cell converter 110 is insufficient with respect to target output electric power. In this embodiment, the case where the output electric power from the fuel cell converter 110 is insufficient with respect to the target output electric power is referred to as a transient state.

In a case where regenerative electric power is generated in the drive motor 220, the secondary battery converter 130 converts the regenerative electric power from an alternating current to a direct current and outputs the converted regenerative electric power to the low-voltage direct current wire DCL side.

The secondary battery converter 130 can convert the output electric power of the fuel cell stack 100 and output the converted output electric power to the low-voltage direct current wire DCL side. By using the output electric power, the controller 160 can perform control to raise an SOC of the secondary battery 120 in a case where the electric power that can be output from the fuel cell converter 110 exceeds the target output electric power.

The auxiliary machinery 140 is a generic term for auxiliary machinery that is used for the operation of the fuel cell stack 100. The auxiliary machinery 140 includes an air compressor, a hydrogen circulation pump, a water pump, and the like. The auxiliary machinery 140 is electrically connected to the low-voltage direct current wire DCL or the high-voltage direct current wire DCH.

The motor inverter 150 converts the electric power that is supplied in a direct current through the high-voltage direct current wire DCH into three-phase alternating current electric power. The motor inverter 150 is electrically connected to the drive motor 220 and supplies the three-phase alternating current electric power to the drive motor 220. The motor inverter 150 converts the regenerative electric power that is generated in the drive motor 220 into direct current electric power and outputs the direct current electric power to the high-voltage direct current wire DCH.

The controller 160 is configured of a plurality of ECUs. The controller 160 controls the operation of each part of the first power unit 21, including the above-described contents.

Figure 6:
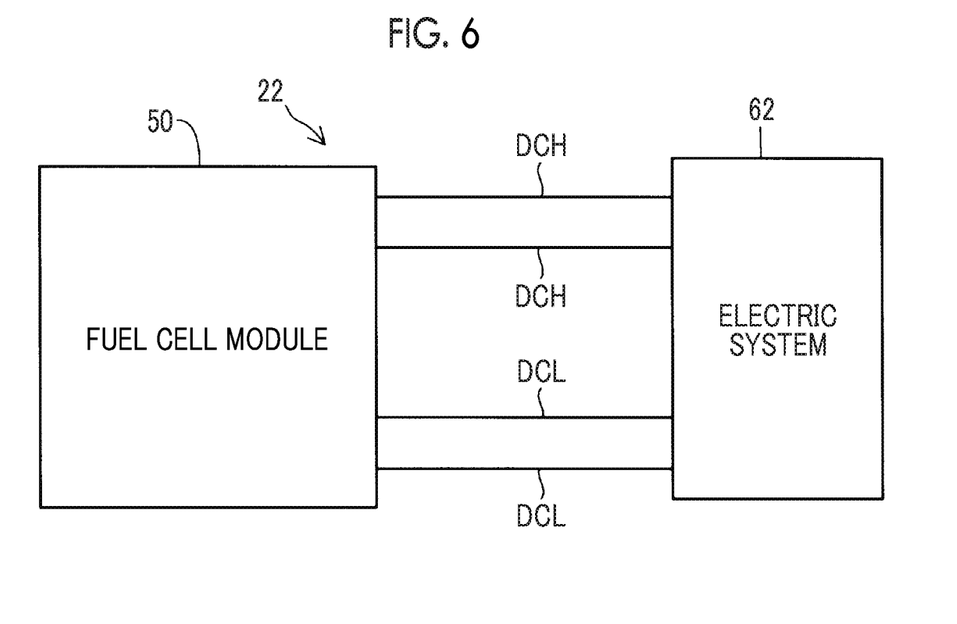
FIG. 6 is a block diagram showing a configuration of a second power unit.

FIG. 6 is a block diagram showing a configuration of the second power unit 22. The second power unit 22 is provided with the fuel cell module 50 and an electric system 62. The third power unit 23 is provided with the fuel cell module 50 and an electric system. The electric system that is included in the third power unit 23 is not shown in the drawing.

The fuel cell module 50 that is mounted on the second power unit 22 is the same as the fuel cell module 50 that is mounted on the first power unit 21. The fuel cell module 50 that is mounted on the third power unit 23 is also the same as the fuel cell module 50 that is mounted on the first power unit 21. That is, in any of the fuel cell stack 100, the hydrogen tank 105, the fuel cell converter 110, and the auxiliary machinery 140, design thereof is the same as the design of those mounted on the first power unit 21.

The electric system 62 is common to the electric system 61 in that the electric system 62 is provided with a secondary battery, a secondary battery converter, a motor inverter, a controller, and a drive motor. However, each part configuring the electric system 62 is designed for use in the fuel cell vehicle 12. Similarly, each part configuring the electric system that is included in the third power unit 23 is designed for use in the fuel cell vehicle 13. For example, the output characteristics of the secondary battery or the maximum output of the drive motor is different from the case of the fuel cell vehicle 11.

The fuel cell vehicle 13 is provided with two electric systems, and therefore, the fuel cell vehicle 13 is provided with two drive motors. The two drive motors are connected in series and rotate the single propeller shaft 25.

Figure 7:
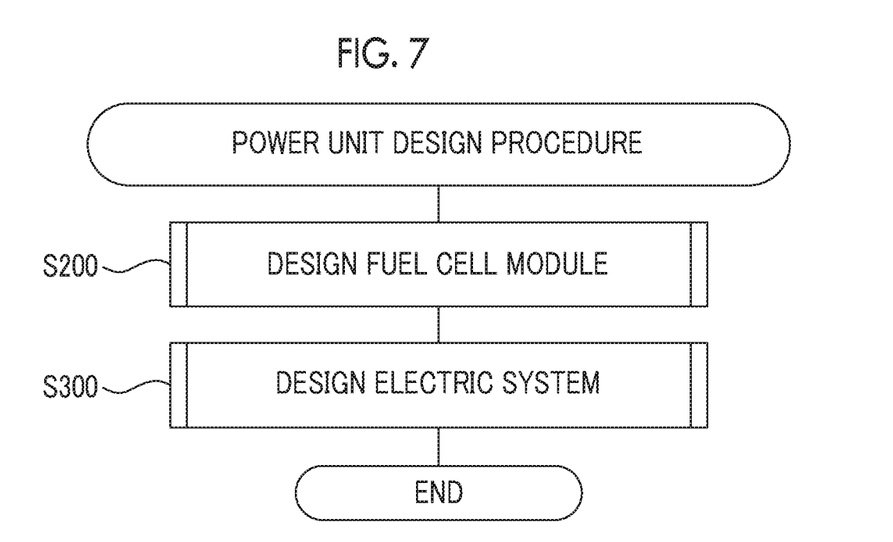
FIG. 7 is a flowchart showing a procedure for designing a power unit.

FIG. 7 is a flowchart showing a procedure for designing a power unit. The second power unit 22 and the third power unit 23 are designed according to the design procedure shown in FIG. 7 by using the design of the first power unit 21. As shown in FIG. 7, the fuel cell module is designed (S200), and thereafter, the electric system is designed (S300). Prior to the description of S200 and S300, the design of the first power unit 21 will be described as the premise of the design procedure.

Figure 8:
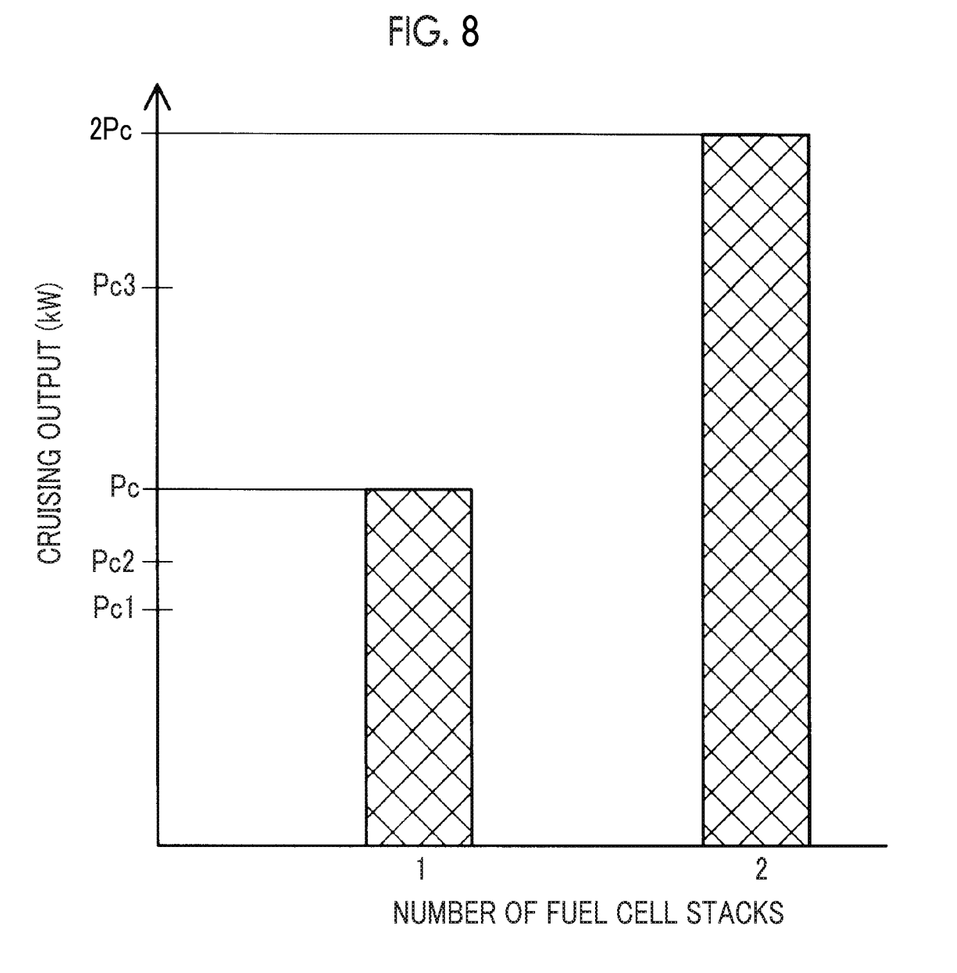
FIG. 8 is a bar graph showing a relationship between a cruising output and the number of fuel cell stacks.

FIG. 8 is a bar graph in which the output in a cruise condition is shown on the vertical axis and the number of fuel cell stacks 100 is shown on the horizontal axis. Originally, the fuel cell module 50 is designed to be mounted on the fuel cell vehicle 11.

In the design of the fuel cell vehicle 11, the idea that the fuel cell stack 100 is designed such that cruise traveling can be performed solely by the power generation by the fuel cell stack 100 without relying on the power supply by the secondary battery 120 was adopted. Further, since the fuel cell vehicle 11 is a passenger car and a mounting space is limited, the design concept that the number of fuel cell stacks 100 that are mounted is set to be one was adopted.

In FIG. 8, output needed for cruise traveling of the fuel cell vehicle 11 (hereinafter referred to as cruising output) is shown as an output value Pc1. The cruise condition is a traveling condition that is determined for each vehicle. Specifically, a case of traveling on a horizontal road was assumed and the maximum vehicle speed at which the SOC can be maintained was set to be in a regular range. That is, in a case of traveling on a horizontal road, when the vehicle speed is equal to or lower than the maximum vehicle speed, in principle, as long as electric power generated by the fuel cell stack 100 is supplied to the drive motor 220, cruise traveling is possible even without discharging from the secondary battery 120. In this case, the SOC can be maintained with hardly increasing or decreasing. The fact that the SOC can be maintained does not exclude the ability to increase the SOC by charging.

In this embodiment, in a case of traveling at the maximum vehicle speed, the maximum vehicle speed is determined such that extended cruise traveling is also possible. The extended cruise traveling is traveling at a predetermined traveling distance with the SOC balance set to zero in a case where the average of a gradient is substantially zero.

For example, in a case of traveling on a downward slope after a short ascending slope, when traveling on the ascending slope, discharge from the secondary battery 120 is performed in addition to the power generation by the fuel cell stack 100, and in the downward slope, the value of the SOC can be returned to the value before the traveling on the ascending slope by charging the secondary battery 120 with at least one of the power generation by the fuel cell stack 100 or the regenerative electric power. As described above, when the balance between the discharge amount and the charge amount of the secondary battery 120 matches within a short period of time, it is possible to maintain the SOC. The traveling described above is referred to as extended cruise traveling.

The extended cruise traveling also includes the following traveling. When traveling on a horizontal road, by using the discharge of the secondary battery 120 for a predetermined time (about 10 minutes), traveling at a vehicle speed exceeding the maximum vehicle speed is possible. In a case where cruise traveling is started with the traveling speed slowed down before the SOC reaches the lower limit value of an actual use range, thereafter, in a case where there is an opportunity of charging the secondary battery 120, when the vehicle speed returns to the value of the SOC before the traveling at the vehicle speed exceeding the maximum vehicle speed, it means that the extended cruise traveling has been performed.

As a result of the design of the fuel cell stack 100, the fuel cell stack 100 can continuously output an output value Pc. The output value Pc is larger than the output value Pc1. For this reason, the design concept described above is satisfied.

Figure 9:
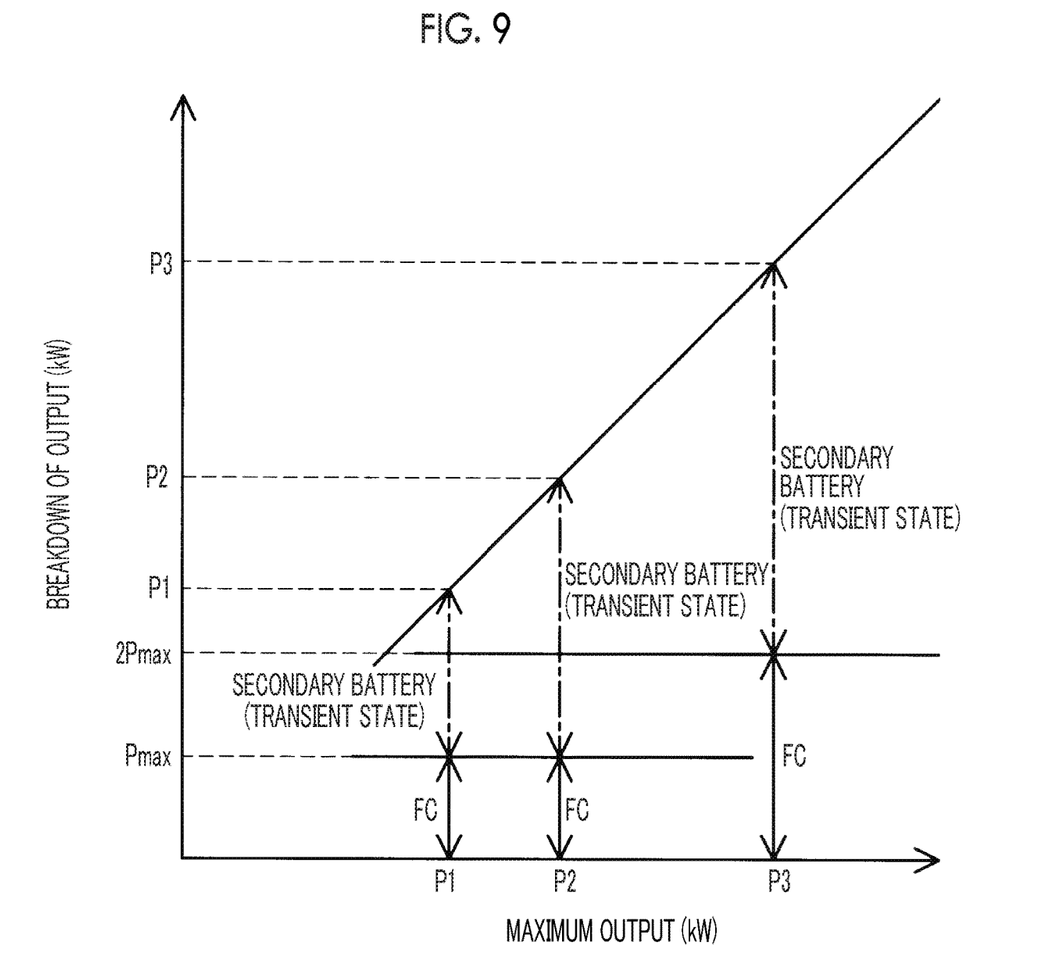
FIG. 9 is a graph in which a breakdown of output is shown on a vertical axis and the maximum output is shown on a horizontal axis.

FIG. 9 is a graph in which a breakdown of output is shown on a vertical axis and the maximum output is shown on a horizontal axis. In the design of a vehicle, the maximum output is determined. The maximum output is usually determined in order to maintain acceleration performance. For example, the maximum output is determined as a condition that the vehicle speed reaches from 0 km/h to 100 km/h within a time (hereinafter referred to as an acceleration time) determined in advance (hereinafter referred to as an acceleration condition). The maximum output of the fuel cell vehicle 11 is determined to be an output value P1 shown in FIG. 9.

On the other hand, the maximum output of the fuel cell stack 100 is an output value Pmax shown in FIG. 9. The output value Pmax is usually larger than the output value Pc. The reason is that, in the acceleration condition, the temperature of the fuel cell stack 100 is allowed to be high compared to the cruise condition.

However, as shown in FIG. 9, the output value Pmax is smaller than the output value P1. For this reason, it is not possible to realize the maximum output of the fuel cell vehicle 11 solely by the power generation by the fuel cell stack 100. The shortage of the fuel cell stack 100, which is obtained by subtracting the output value Pmax from the maximum output, is supplemented by the output of the secondary battery 120. That is, the secondary battery 120 is designed such that the maximum output of the secondary battery 120 is substantially equal to the shortage. Further, in the secondary battery 120, the capacity and the SOC in the actual use range are designed so as to satisfy the acceleration condition.

In FIG. 9, the transient state attached in parentheses to the secondary battery indicates that the secondary battery is designed not to supply power to the drive motor in the cruise condition.

The fuel cell module 50 designed as described above is diverted to the design of the power units that are mounted on the fuel cell vehicles 12, 13. Hereinafter, description will be made according to the flowcharts shown in FIG. 10 and FIG. 11.

Figure 10:
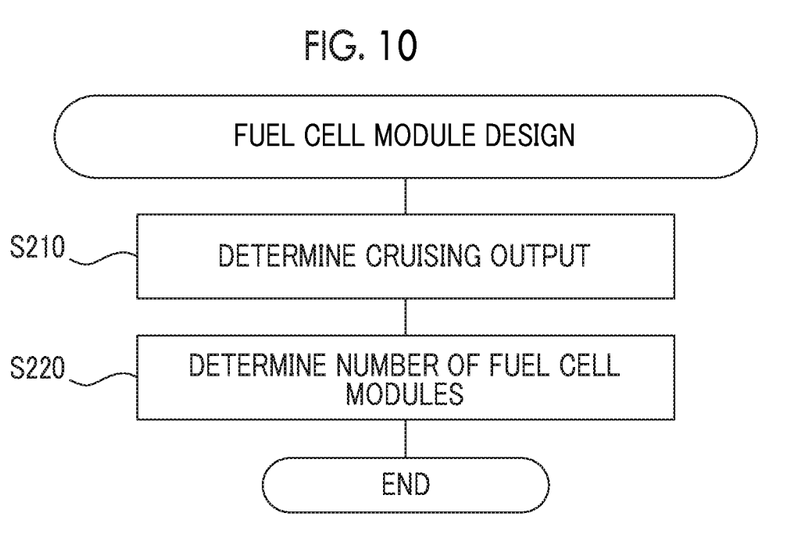
FIG. 10 is a flowchart showing a procedure for designing a fuel cell module.

As the procedure for designing the fuel cell module, as shown in FIG. 10, the cruising output is determined (S210). The value determined as the cruising output of the fuel cell vehicle 12 is shown as an output value Pc2 in FIG. 8. The value determined as the maximum output of the fuel cell vehicle 13 is shown as an output value Pc3 in FIG. 8.

The number of fuel cell modules 50 is determined (S220). The number of fuel cell modules 50 to be determined is represented by n. n is a natural number. n is determined as a value that satisfies the following expression.

$$(n-1)Pc < \text{cruising output} \leq nPc \tag{1}$$

As shown in FIG. 8, in the case of the fuel cell vehicle 12, n satisfying the expression (1) is 1. As shown in FIG. 8, in the case of the fuel cell vehicle 13, n satisfying the expression (1) is 2. In this embodiment, the number of fuel cell modules 50 is synonymous with the number of power units.

As described above, the design of the fuel cell module 50 is specifically ended merely by determining the number of fuel cell modules 50 that are mounted. The determination of the cruising output is a step that is also performed in a hybrid vehicle or an engine vehicle, and it does not affect a development cost and a development period, as a step specific to the design of the fuel cell vehicle.

Figure 11:
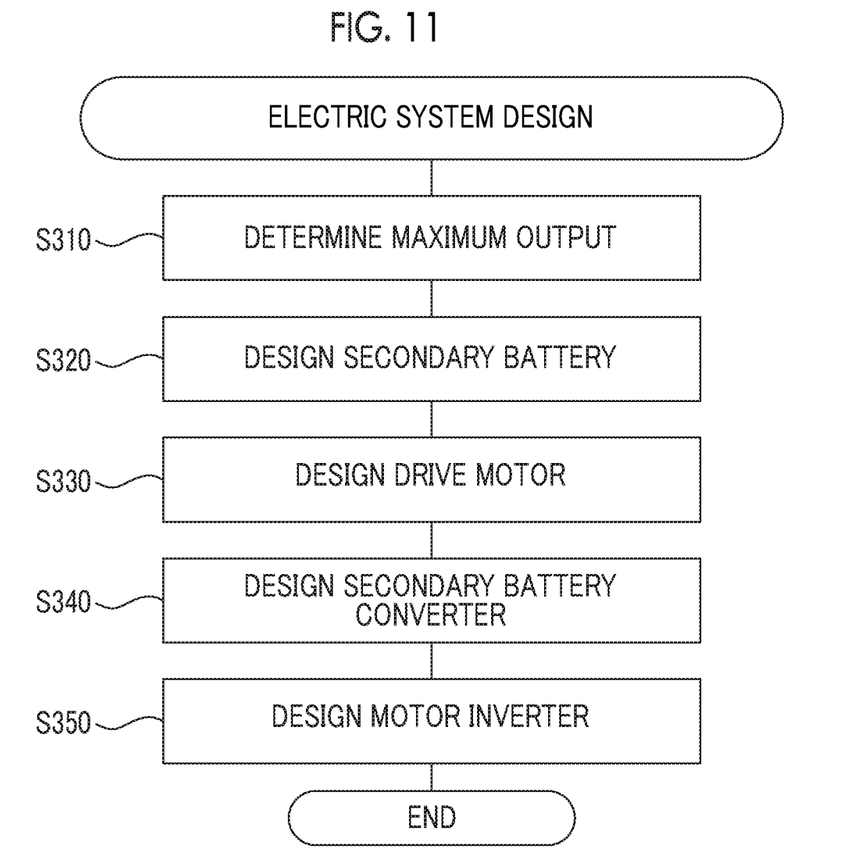
FIG. 11 is a flowchart showing a procedure for designing an electric system.

As the design of the electric system, as shown in FIG. 11, the maximum output is determined (S310). The value determined as the maximum output of the fuel cell vehicle 12 is shown as the output value P2 in FIG. 9. The value determined as the maximum output of the fuel cell vehicle 13 is shown as the output value P3 in FIG. 9.

The secondary battery is designed (S320). The design of the secondary battery is performed in the same manner as in the case of the fuel cell vehicle 11. In the case of the fuel cell vehicle 12, the maximum output of the secondary battery corresponds to (P2−Pmax). In the case of the fuel cell vehicle 13, the maximum output of the secondary battery corresponds to (P3−2Pmax). In the case of the fuel cell vehicle 13, since n=2, that is, two third power units 23 are mounted, the maximum output of the secondary battery that is included in one third power unit 23 corresponds to (P3−2Pmax)/2.

Step S320 in this embodiment is specifically a procedure for determining how many cells are stacked. In this embodiment, the cells to be used are determined in advance. For this reason, the design of the secondary battery can be performed merely by determining the number of cells according to the concept described above.

The drive motor is designed (S330). The design of the drive motor is performed with the same idea as the design of the secondary battery in S320. That is, a design is performed so as to satisfy the needed maximum output and the output in the cruise condition.

The secondary battery converter is designed (S340), and finally, the motor inverter is designed (S350).

Figure 12:
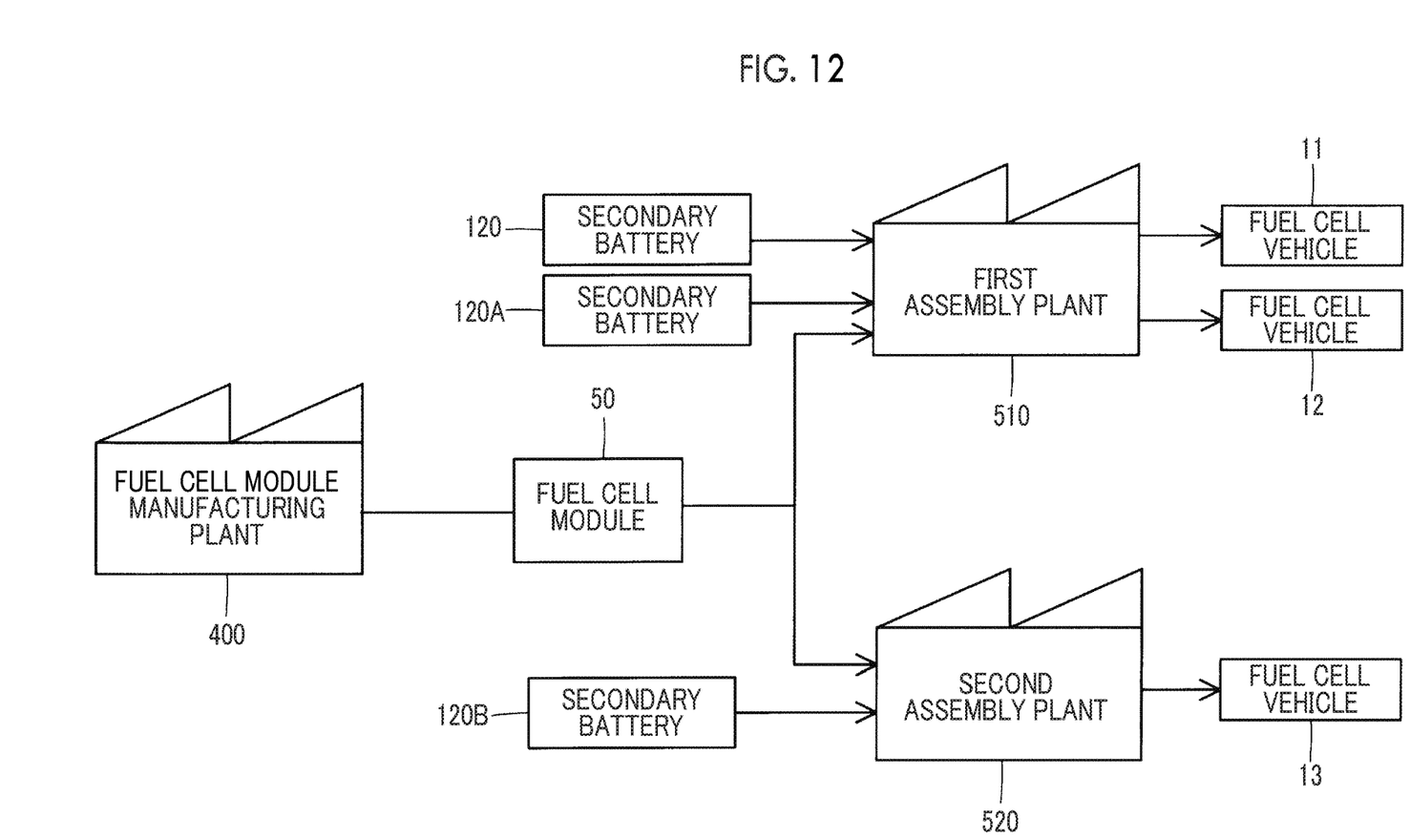
FIG. 12 is a diagram schematically showing the flow of manufacture of the fuel cell vehicle.

FIG. 12 schematically shows the flow of manufacture of the fuel cell vehicles 11, 12, 13. The fuel cell module 50 is manufactured in a fuel cell module manufacturing plant 400. The manufactured fuel cell module 50 is conveyed to a first assembly plant 510 and a second assembly plant 520.

Secondary batteries 120, 120A are conveyed to the first assembly plant 510. The secondary battery 120A is a secondary battery that is included in the electric system 62. A secondary battery 120B is conveyed to the second assembly plant 520. The secondary battery 120B is a secondary battery that is included in the third power unit 23.

In the first assembly plant 510, assembly of the fuel cell vehicles 11, 12 is performed. The first assembly plant 510 adopts a mixed model assembly line. That is, the fuel cell vehicles 11, 12 are continuously assembled by mixture in a single production line.

In the second assembly plant 520, assembly of the fuel cell vehicle 13 is performed. Since the vehicle body of the fuel cell vehicle 13 is significantly larger than the vehicle bodies of the fuel cell vehicles 11, 12, the fuel cell vehicle 13 is assembled in a production line separate from the production line for the fuel cell vehicles 11, 12.

According to the embodiment described above, the development cost and the development period for newly designing a fuel cell vehicle are reduced compared to a method of newly designing the fuel cell module 50. One of the reasons that the effect as described above is obtained lies in the design concept that the cruising output is supplied by the output of the fuel cell stack and in the transient state, the shortage of the output by the fuel cell stack is supplemented by the output of the secondary battery.

Further, also in the manufacturing process, since the fuel cell module 50 is a common part, the manufacturing cost is reduced.

This disclosure is not limited to the embodiment or the example of this specification and can be realized in various configurations within a scope that does not depart from the gist of this disclosure. For example, technical features in embodiments or examples corresponding to technical features in the respective aspects described in the Summary can be appropriately replaced or combined in order to solve some or all of the problems described above, or in order to achieve some or all of the effects described above. Unless a technical feature is described as being indispensable to this specification, the technical feature can be appropriately deleted. For example, the following features are exemplified.

The power units that are mounted on the respective fuel cell vehicles may not have the same design. For example, at least a part of the hydrogen tank, the fuel cell converter, and the auxiliary machinery may be changed in design.

The fuel cell stacks that are mounted on the respective fuel cell vehicles may not be completely identical in design. That is, a design change may also be made on the non-essential contents as the design of the fuel cell stack. For example, the position of the current collecting terminal 161 may be changed in accordance with an automobile on which the current collecting terminal 161 is mounted. The indispensable contents as the design of the fuel cell stack can also be regarded as, for example, the maximum output and the cruising output, or can also be regarded as the number of cells 101 and the area of a power generation region.

The motor truck may not be a type that tows a trailer. For example, the motor truck may be a full trailer or may be a dump truck.

In the design of the motor truck, the number of fuel cell modules 50 may be determined to be one. For example, a pickup truck or the like can be mentioned.

In the design of an automobile other than the motor truck, the number of fuel cell modules 50 may be determined to be two or more. For example, a large-sized bus or the like can be mentioned.

The design method described as the embodiment may be applied to other machines that are provided with a motor, in addition to the automobile. For example, a fuel cell module designed for use in an automobile may be diverted as a fuel cell module that is mounted on another electric machine. As other machines, for example, a construction machine, a robot, transportation equipment other than an automobile, or the like can be mentioned. The robot includes a type that walks on the ground, a type that travels on the ground with wheels, and a type that flies in the sky. As the transportation equipment other than an automobile, an electric railcar, a motorcycle, a helicopter, and the like are included.

The machine may be a connected car. The connected car is an automobile that is provided with a communication device and can receive services through communication with the cloud.

What is claimed is:

1. A method of designing a machine on which a drive motor, a fuel cell stack configured to generate an electric current for driving the drive motor, and a secondary battery configured to discharge an electric current for driving the drive motor are mounted, the method comprising:
    determining a maximum output of the drive motor to be a first output value and an output of the drive motor when a vehicle travels under a cruise condition to be a second output value;
    determining the number of fuel cell stacks to be mounted to be n, n being a natural number, and an output value outputted by the fuel cell stacks when the vehicle travels under the cruise condition being a third output value; and
    determining a maximum output of the secondary battery to be a value obtained by subtracting a value obtained by multiplying a maximum output of the fuel cell stack by the n, from the first output value, wherein:
    a value obtained by multiplying the third output value by the n is equal to or larger than the second output value; and
    a value obtained by multiplying the third output value by (n−1) is less than the second output value.

2. The method according to claim 1, wherein the method of designing the fuel cell stack is the same as a method of designing a fuel cell stack mounted on a machine designed separately from the machine.

3. The method according to claim 1, wherein the machine is designed such that, when the vehicle travels under the cruise condition, a state of charge of the secondary battery is maintained.

4. The method according to claim 1, further comprising:
    designing the machine so as to mount a fuel cell converter electrically connected to the fuel cell stack, the fuel cell converter being configured to control a power generation voltage of the fuel cell stack, a hydrogen tank configured to store hydrogen for being supplied to the fuel cell stack, and auxiliary machinery for power generation by the fuel cell stack; and
    designing the machine so as to be installed with at least one of the fuel cell converter, the hydrogen tank, and the auxiliary machinery by n sets when the n is 2 or more.

5. The method according to claim 1, wherein the machine is an automobile.

6. The method according to claim 5, wherein in a case where the n is 2 or more, the automobile is a motor truck.

7. The method according to claim 5, wherein when the automobile is a motor truck, the n is 2 or more.

* * * * *